US008742564B2

(12) United States Patent
Lou et al.

(10) Patent No.: US 8,742,564 B2
(45) Date of Patent: Jun. 3, 2014

(54) CHIP PACKAGE AND METHOD FOR FORMING THE SAME

(76) Inventors: Bai-Yao Lou, Hsinchu (TW); Tsang-Yu Liu, Zhubei (TW); Chia-Sheng Lin, Zhongli (TW); Tzu-Hsiang Hung, Kaohsiung (TW)

( * ) Notice: Subject to any disclaimer, the term of this patent is extended or adjusted under 35 U.S.C. 154(b) by 0 days.

(21) Appl. No.: 13/350,520

(22) Filed: Jan. 13, 2012

(65) Prior Publication Data
US 2012/0181672 A1    Jul. 19, 2012

Related U.S. Application Data

(60) Provisional application No. 61/433,379, filed on Jan. 17, 2011.

(51) Int. Cl.
*H01L 23/48* (2006.01)
*H01L 23/52* (2006.01)

(52) U.S. Cl.
USPC ............ 257/690; 257/396; 257/398; 257/704

(58) Field of Classification Search
USPC ................................. 257/678–796; 438/108
See application file for complete search history.

(56) References Cited

U.S. PATENT DOCUMENTS

| | | | | |
|---|---|---|---|---|
| 7,482,678 B2 * | 1/2009 | Kertesz et al. | ................. | 257/659 |
| 7,759,800 B2 * | 7/2010 | Rigg et al. | ..................... | 257/774 |
| 7,834,461 B2 * | 11/2010 | Asai et al. | ..................... | 257/774 |
| 7,919,835 B2 * | 4/2011 | Akiyama | ..................... | 257/621 |
| 7,989,954 B2 * | 8/2011 | Lin et al. | ....................... | 257/758 |
| 8,021,918 B2 * | 9/2011 | Lin et al. | ....................... | 438/106 |
| 8,274,157 B2 * | 9/2012 | Koide et al. | .................... | 257/776 |
| 2005/0104204 A1 * | 5/2005 | Kawakubo et al. | ........... | 257/724 |
| 2007/0018320 A1 * | 1/2007 | Tanida et al. | ................. | 257/737 |
| 2008/0284041 A1 * | 11/2008 | Jang et al. | ..................... | 257/774 |
| 2010/0007030 A1 * | 1/2010 | Koike et al. | .................... | 257/774 |
| 2010/0140752 A1 * | 6/2010 | Marimuthu et al. | .......... | 257/621 |
| 2011/0001236 A1 * | 1/2011 | Koide et al. | .................... | 257/737 |
| 2011/0024864 A1 * | 2/2011 | Kokusenya et al. | .......... | 257/448 |
| 2011/0024900 A1 * | 2/2011 | Walter et al. | .................... | 257/737 |
| 2011/0031606 A1 * | 2/2011 | Chen et al. | ..................... | 257/690 |
| 2011/0042741 A1 * | 2/2011 | Fukuoka et al. | .............. | 257/330 |
| 2011/0057321 A1 * | 3/2011 | Wang et al. | .................... | 257/774 |
| 2011/0057323 A1 * | 3/2011 | Chia | .............................. | 257/774 |
| 2011/0084385 A1 * | 4/2011 | Itaya et al. | ..................... | 257/737 |
| 2011/0089571 A1 * | 4/2011 | Matsuo | ......................... | 257/774 |
| 2011/0156246 A1 * | 6/2011 | Chen et al. | ..................... | 257/724 |
| 2011/0156247 A1 * | 6/2011 | Chen et al. | ..................... | 257/724 |
| 2011/0175221 A1 * | 7/2011 | Ni et al. | ......................... | 257/737 |
| 2011/0186990 A1 * | 8/2011 | Mawatari et al. | .............. | 257/737 |
| 2011/0221070 A1 * | 9/2011 | Yen et al. | ....................... | 257/774 |
| 2011/0241040 A1 * | 10/2011 | Yu et al. | ........................... | 257/91 |
| 2011/0241205 A1 * | 10/2011 | Kirby et al. | .................... | 257/738 |

(Continued)

FOREIGN PATENT DOCUMENTS

CN    101465299    6/2009
CN    101510536    8/2009

*Primary Examiner* — Ngan Ngo
(74) *Attorney, Agent, or Firm* — Liu & Liu

(57) ABSTRACT

An embodiment of the invention provides a chip package which includes a substrate having a first surface and a second surface; a conducting pad structure located on the first surface; a dielectric layer located on the first surface of the substrate and the conducting pad structure, wherein the dielectric layer has an opening exposing a portion of the conducting pad structure; and a cap layer located on the dielectric layer and filled into the opening.

18 Claims, 3 Drawing Sheets

(56) References Cited

U.S. PATENT DOCUMENTS

| | | |
|---|---|---|
| 2011/0278734 A1* | 11/2011 | Yen et al. ............... 257/774 |
| 2011/0304057 A1* | 12/2011 | Matsumoto ............. 257/774 |
| 2012/0007154 A1* | 1/2012 | Lin et al. ............... 257/288 |
| 2012/0013002 A1* | 1/2012 | Hsu ....................... 257/737 |
| 2012/0146108 A1* | 6/2012 | Chang et al. ........... 257/288 |
| 2012/0168935 A1* | 7/2012 | Huang .................... 257/737 |
| 2013/0001772 A1* | 1/2013 | Koide et al. ............ 257/737 |
| 2013/0020722 A1* | 1/2013 | Matsuo ................... 257/774 |
| 2013/0026640 A1* | 1/2013 | Ito et al. ................. 257/773 |

* cited by examiner

CHIP PACKAGE AND METHOD FOR FORMING THE SAME

CROSS REFERENCE TO RELATED APPLICATIONS

This Application claims the benefit of U.S. Provisional Application No. 61/433,379, filed on Jan. 17, 2011, the entirety of which is incorporated by reference herein.

BACKGROUND OF THE INVENTION

1. Field of the Invention

The present invention relates to a chip package, and in particular relates to a chip package having a through substrate conducting structure.

2. Description of the Related Art

The chip packaging process is an important process when fabrication an electronic product. Chip packages not only provide chips with protection from environmental contaminants, but also provide an interface for electrical connections between electronic elements in the chips and electronic elements outside of the chip packages.

Before the chip package process, a probing process should be performed to ensure quality of the chips. However, the probing process may hinder the subsequent package process, and may leave or lead to defects in the chip packages.

Improving reliability and structural stability of a chip package has become an important issue.

BRIEF SUMMARY OF THE INVENTION

An embodiment of the invention provides a chip package, which includes: a substrate having a first surface and a second surface; a conducting pad structure located on the first surface of the substrate; a dielectric layer located on the first surface of the substrate and the conducting pad structure, wherein the dielectric layer has an opening exposing a portion of the conducting pad structure; and a cap layer located on the dielectric layer and filled into the opening.

An embodiment of the invention provides a method for forming a chip package, which includes: providing a substrate having a first surface and a second surface, wherein a conducting pad structure and a dielectric layer are disposed on the first surface, and the dielectric layer is located on the conducting pad structure and has an opening exposing a portion of the conducting pad structure; and forming a cap layer on the dielectric layer, wherein the cap layer fills into the opening.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package various chips. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits.

Figure 1:
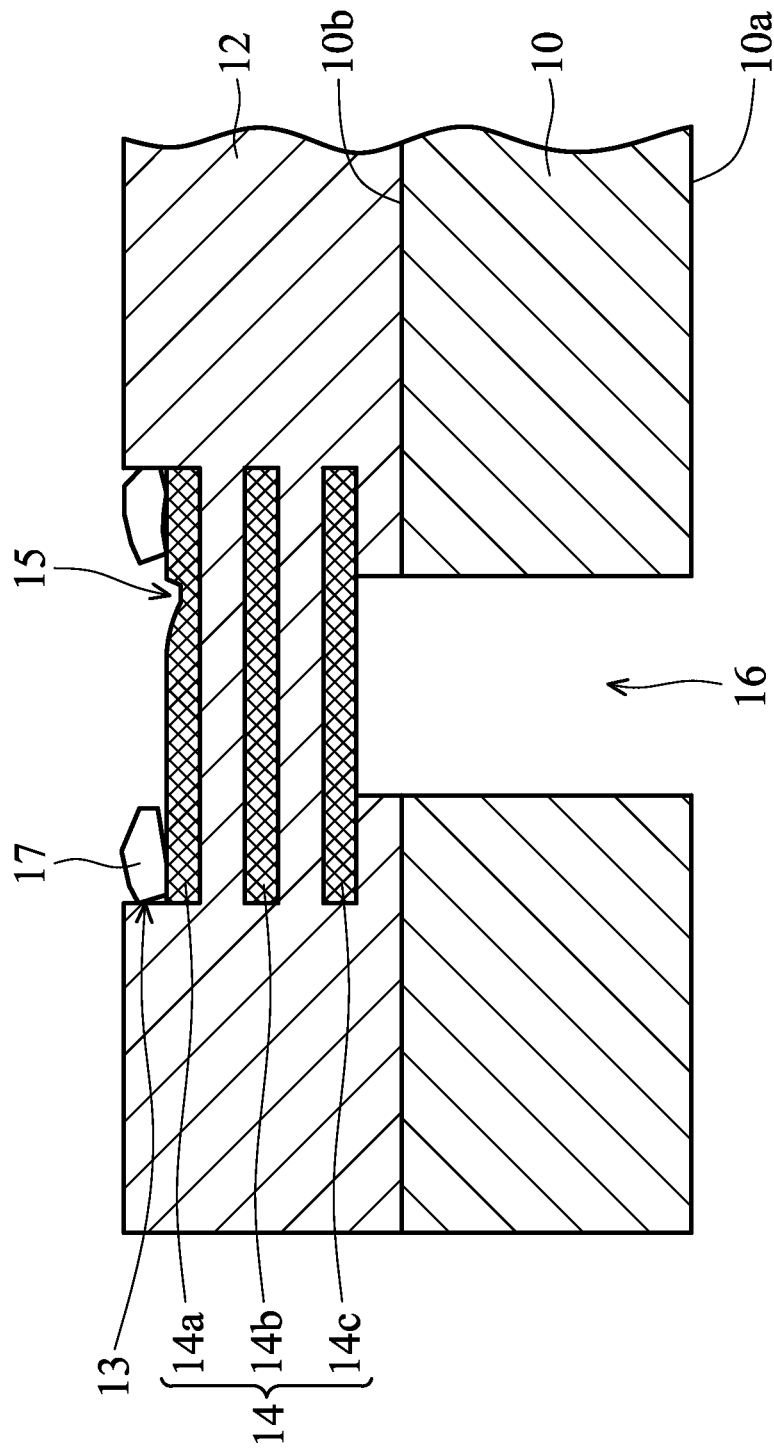
FIG. 1 shows a cross-sectional view of a chip package known by the inventor of the present application.

FIG. 1 shows a cross-sectional view of a chip package known by the inventor of the present application. FIG. 1 shows a cross-sectional view of a chip package known by the inventor of the present application. A dielectric layer 12 and a conducting pad structure 14 are disposed on the substrate 10. The conducting pad structure 14 electrically connects to a device (not shown) in the substrate 10. The conducting pad structure 14 may include a plurality of stacked conducting pads, such as conducting pads 14a, 14b, and 14c. The substrate 10 is, for example, a silicon wafer, and a probing process typically needs to be performed thereon before proceeding with the subsequent dicing process and package process. In general, a portion of the dielectric layer 12 needs to be removed to form an opening 13, so as to expose an upper conducting pad 14a of the conducting pad structure 14. Then, a probe may be used for contact with the exposed conducting pad 14a to perform a required electrical property measurement. The probe usually damages a portion of the conducting pad 14a, thereby producing a recess (or a notch) 15, which results in a decrease in strength of the conducting pad 14a.

After the probing process, the subsequent package process may be performed on the portion passing the probing detection. For example, a portion of the substrate 10 may be removed from a surface 10a of the substrate 10 so as to form a hole 16 extending toward a surface 10b. In the subsequent process, a through substrate conducting structure may be formed in the hole 16 and electrically connected to the conducting pad structure 14. However, because the conducting pad structure 14 has been damaged and has a smaller thickness, damage easily occurs with the conducting pad structure 14 in the subsequent process (such as the forming process of the hole 16), which results in chip failure. Furthermore, bubbles 17 easily occur in the subsequent bonding process due to a step structure between the dielectric layer 12 and the conducting pad structure 14, thereby affecting the reliability of the chip package.

Figure 2:
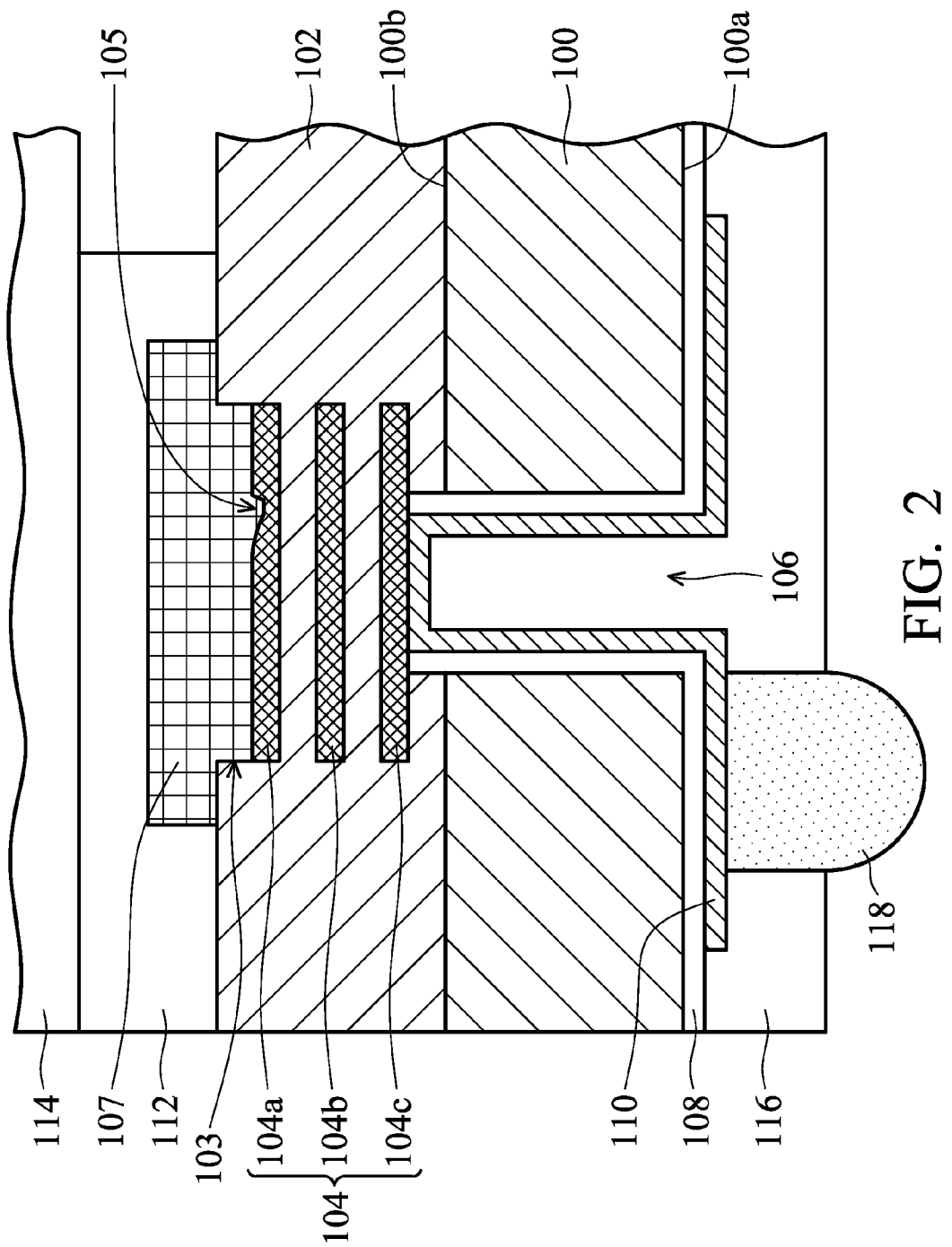
FIG. 2 shows a cross-sectional view of a chip package according to an embodiment of the present invention.

In order to resolve the above problems discovered by the inventor, embodiments are provided as follows. FIG. 2 shows a cross-sectional view of a chip package according to an embodiment of the present invention to illustrate the forming process of the chip package. In one embodiment, a substrate 100 is provided, which has a surface 100a and a surface 100b. The substrate 100 includes a semiconductor substrate, such as a silicon wafer. A conducting pad structure 104 and a dielectric layer 102 are disposed on the surface 100a of the substrate 100. The dielectric layer 102 is located on the conducting pad structure 104 and has an opening 103. The opening 103 exposes a portion of the conducting pad structure 104. A device region (not shown) may be formed in the substrate 100 and electrically connected to the conducting pad structure 104. In one embodiment, the conducting pad structure 104 may include a plurality of conducting pads stacked with each other, wherein the conducting pads include, for example, but are not limited to, a top conducting pad 104a, a lowest conducting pad 104c, and a middle conducting pad 104b between the conducting pads 104a and 104c.

Then, a probing process may be optionally performed on the substrate 100. For example, a probe (not shown) may be used for contact with the exposed conducting pad 104a to perform a required electrical property measurement. The probe usually damages a portion of the conducting pad 104a, thereby producing a recess (or a notch) 105.

Before proceeding with the subsequent forming process of a through substrate conducting structure, a cap layer 107 is formed on the dielectric layer 102. The cap layer 107 further fills into the opening 103 of the dielectric layer 102. In one embodiment, the opening 103 may be substantially filled with the cap layer 107 so as to avoid producing bubbles in the subsequent bonding process. In one embodiment, the cap layer 106 directly contacts with the conducting pad structure 104. For example, in the embodiment of FIG. 2, the cap layer 106 directly contacts with a bottom surface of the conducting pad 104c. Furthermore, the cap layer 107 may support the conducting pad structure 104 to ensure that the conducting pad structure 104 is not broken in the subsequent chip package process or when the finished product of the chip package is operational.

In one embodiment, a thickness of the cap layer 107 may be larger than a thickness of any conducting pad (such as one of the conducting pads 104a, 104b, and 104c) of the conducting pad structure 104. In one embodiment, a material of the cap layer 107 is different from that of the conducting pad structure 104. In one embodiment, the material of the cap layer 107 includes a metal material, a ceramic material, a polymer material, or combinations thereof.

Then, a carrier substrate 114 may be optionally bounded to the surface 100b of the substrate 100, and a spacer layer 112 may be optionally sandwiched between the carrier substrate 114 and the substrate 100. Because the cap layer 107 was previously formed, bubbles are not formed in the step of bonding the carrier substrate 114, such that the reliability of the chip package is improved.

Then, a thinning-process may be optionally performed on the surface 100a of the substrate 100 by taking the carrier substrate 114 as support. Then, a portion of the substrate 100 may be removed from the surface 100a of the substrate 100 to form a hole 106 extending toward the surface 100b by, for example, but is not limited to, a photolithography and etching process.

Then, an insulating layer 108 may be formed on a sidewall of the hole 106. The formed insulating layer 108 usually covers the conducting pad structure 104 located on the bottom of the hole 106. Therefore, the insulating layer 108 on the bottom of the hole 106 may be further removed so as to expose a portion of the conducting pad structure 104. For example, the conducting pad 104c is exposed. Because the cap layer 107 was previously formed, the conducting pad structure 104 can be sufficiently supported in the forming process of the hole 106 to ensure that the conducting pad structure 104 is substantially not damaged.

Then, a conducting layer 110 may be formed on the insulating layer 108 on the sidewall of the hole 106. The conducting layer 110 may electrically contact with the conducting pad structure 104. In the embodiment of FIG. 2, the conducting layer 110 may directly contact with the conducting pad 104c. In one embodiment, the conducting layer 110 may extend onto the insulating layer 108 on the substrate 100.

Then, a protective layer 116 may be optionally formed on the surface 100a of the substrate 100. The protective layer 116 may have an opening exposing the conducting layer 110. Then, a conductive bump 118 may be formed in the opening of the protective layer 116, and then the substrate 100 is diced along predetermined scribe lines (not shown) to form at least one chip package.

Figure 3:
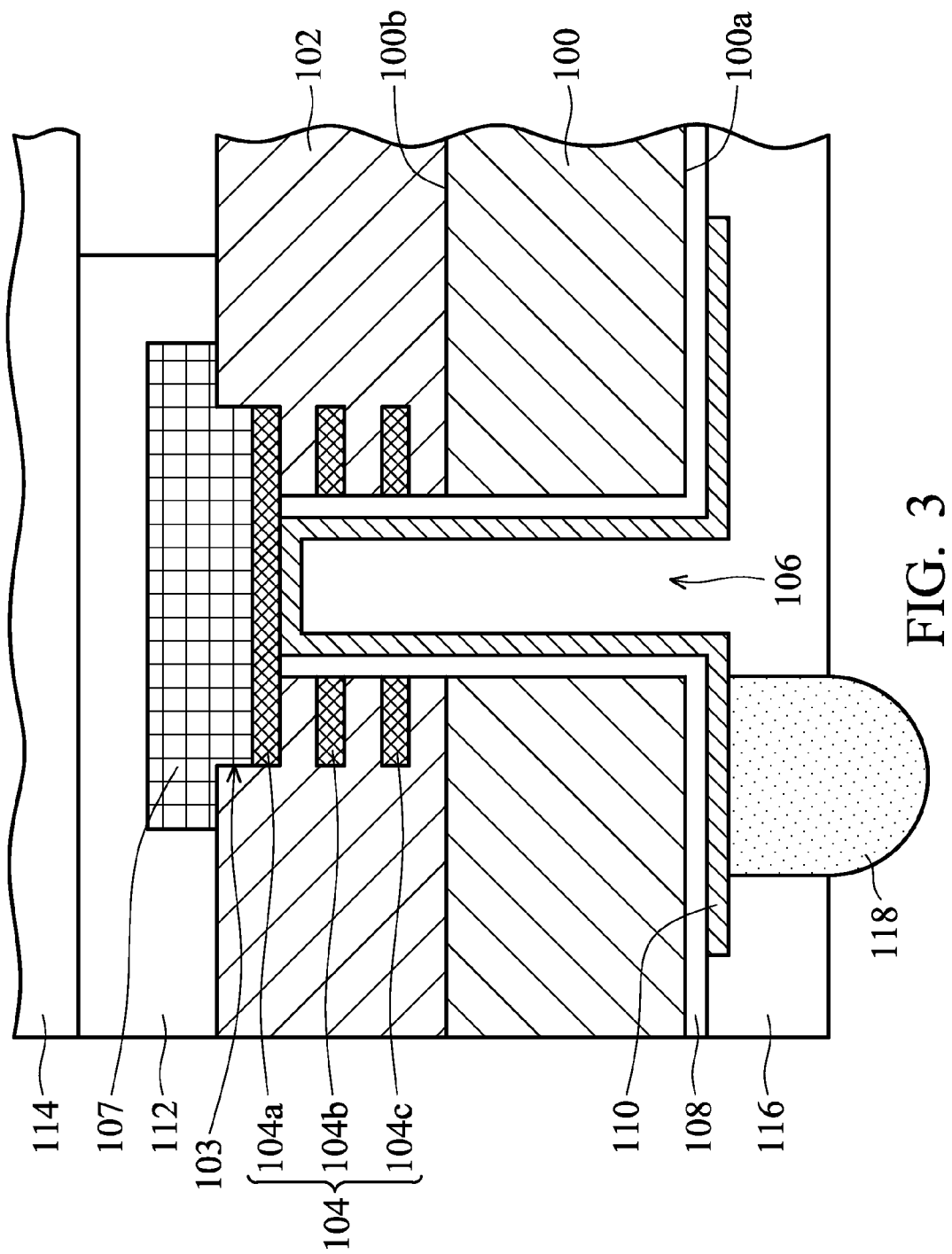
FIG. 3 shows a cross-sectional view of a chip package according to one embodiment of the present invention.

FIG. 3 shows a cross-sectional view of a chip package according to another embodiment of the present invention to illustrate the process of the chip package, wherein the same or similar reference numbers are used to represent the same or similar elements.

The embodiment of FIG. 3 is similar to the embodiment of FIG. 2, and the main difference therebetween is that the formed hole 106 further penetrates the conducting pad 104c and exposes the top conducting pad 104a. In this case, the subsequently formed conducting layer 110 may directly contact with the conducting pad 104a. However, it should be noted that, the embodiments of the present invention are not limited thereto. In another embodiment, the formed hole 106 may penetrate the conducting pad 104c and expose a middle conducting pad (such as the conducting pad 104b). In this case, the subsequently formed conducting layer 110 may directly contact with the conducting pad 104b. The extending degree of the hole 106 (i.e. the extending degree of the through substrate conducting structure) depends on required applications.

In the embodiments of the present invention, the reliability of the chip package may be effectively improved through the disposition of the cap layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
a semiconductor substrate having a first surface and a second surface;
a conducting pad structure located on the first surface of the semiconductor substrate;
a dielectric layer located on the first surface of the semiconductor substrate and the conducting pad structure, wherein the dielectric layer has an opening exposing a portion of the conducting pad structure;
a cap layer located on the dielectric layer and filled into the opening;
a conductive bump located on the second surface of the semiconductor substrate, wherein the semiconductor substrate is located between the cap layer and the conductive bump;
a hole extending from the second surface toward the first surface of the semiconductor substrate and exposing a portion of the conducting pad structure;
an insulating layer located on a sidewall of the hole; and
a conducting layer located on the insulating layer on the sidewall of the hole, wherein the conducting layer electrically contacts with the conducting pad structure.

2. The chip package as claimed in claim 1, wherein the conducting pad structure comprises a plurality of conducting pads stacked with each other.

3. The chip package as claimed in claim 2, wherein the hole exposes the lowest conducting pad of the conducting pads, and the conducting layer directly contacts with the lowest conducting pad.

4. The chip package as claimed in claim 2, wherein the hole at least penetrates the lowest conducting pad of the conducting pads, and the conducting layer directly contacts with a middle conducting pad of the conducting pads, wherein the middle conducting pad is located between the lowest conducting pad and a top conducting pad of the conducting pads.

5. The chip package as claimed in claim 2, wherein the hole at least penetrates the lowest conducting pad of the conducting pads, and the conducting layer directly contacts with a top conducting pad of the conducting pads.

6. The chip package as claimed in claim 2, wherein a thickness of the cap layer is larger than a thickness of any conducting pad of the conducting pads.

7. The chip package as claimed in claim 1, wherein a material of the cap layer comprises a metal material, a ceramic material, a polymer material, or combinations thereof.

8. The chip package as claimed in claim 1, wherein a material of the cap layer is different from a material of the conducting pad structure.

9. The chip package as claimed in claim 1, wherein the cap layer directly contacts with the conducting pad structure.

10. The chip package as claimed in claim 9, wherein the conducting pad structure has a recess, and the cap layer fills into the recess.

11. A method for forming a chip package, comprising:
providing a semiconductor substrate having a first surface and a second surface, wherein a conducting pad structure and a dielectric layer are disposed on the first surface, and the dielectric layer is located on the conducting pad structure and has an opening exposing a portion of the conducting pad structure;
locating a cap layer on the dielectric layer and filled into the opening;
removing a portion of the semiconductor substrate from the second surface of the semiconductor substrate to form a hole extending toward the first surface, wherein the hole exposes a portion of the conducting pad structure;
forming an insulating layer on a sidewall of the hole;
forming a conducting layer on the insulating layer on the sidewall of the hole, wherein the conducting layer electrically contacts with the conducting pad structure; and
locating a conductive bump on the second surface of the semiconductor substrate, wherein the semiconductor substrate is located between the cap layer and the conductive bump.

12. The method for forming a chip package as claimed in claim 11, wherein the conducting pad structure comprises a plurality of conducting pads stacked with each other.

13. The method for forming a chip package as claimed in claim 12, wherein the hole exposes the lowest conducting pad of the conducting pads, and the conducting layer directly contacts with the lowest conducting pad.

14. The method for forming a chip package as claimed in claim 12, wherein the step of forming the hole comprises removing a portion of the conducting pad structure such that the hole at least penetrates the lowest conducting pad of the conducting pads and exposes a middle conducting pad of the conducting pads, wherein the middle conducting pad is located between the lowest conducting pad and a top conducting pad of the conducting pads.

15. The method for forming a chip package as claimed in claim 12, wherein the step of forming the hole comprises removing a portion of the conducting pad structure such that the hole at least penetrates the lowest conducting pad of the conducting pads and exposes a top conducting pad of the conducting pads.

16. The method for forming a chip package as claimed in claim 12, wherein a thickness of the cap layer is larger than a thickness of any conducting pad of the conducting pads.

17. The method for forming a chip package as claimed in claim 11, wherein the cap layer directly contacts with the conducting pad structure.

18. The method for forming a chip package as claimed in claim 11, wherein a material of the cap layer comprises a metal material, a ceramic material, a polymer material, or combinations thereof.

* * * * *